(12) United States Patent
Wu

(10) Patent No.: US 9,444,465 B1
(45) Date of Patent: Sep. 13, 2016

(54) LOW PHASE NOISE FREQUENCY DIVIDER

(71) Applicant: Peregrine Semiconductor Corporation, San Diego, CA (US)

(72) Inventor: Gary Chunshien Wu, San Diego, CA (US)

(73) Assignee: Peregrine Semiconductor Corporation, San Diego, CA (US)

(*) Notice: Subject to any disclaimer, the term of this patent is extended or adjusted under 35 U.S.C. 154(b) by 0 days.

(21) Appl. No.: 14/666,060

(22) Filed: Mar. 23, 2015

(51) Int. Cl.
*H03L 7/06* (2006.01)
*H03K 23/42* (2006.01)
*H03L 7/08* (2006.01)

(52) U.S. Cl.
CPC .............. *H03K 23/42* (2013.01); *H03L 7/0802* (2013.01)

(58) Field of Classification Search
USPC .................. 327/105–123, 141, 144–163; 331/15–17; 375/373–376
See application file for complete search history.

(56) References Cited

U.S. PATENT DOCUMENTS

| | | | | |
|---|---|---|---|---|
| 6,094,466 | A | 7/2000 | Yang et al. | |
| 6,668,035 | B2* | 12/2003 | Han | H03M 7/3022 377/48 |
| 6,870,409 | B2* | 3/2005 | Lee | H03L 7/1978 327/105 |
| 7,605,662 | B2* | 10/2009 | Kobayashi | H03D 13/004 331/11 |
| 7,983,378 | B2* | 7/2011 | Kronfeld | H03L 7/193 327/115 |
| 8,058,942 | B2* | 11/2011 | Hammond | H03L 7/1976 327/156 |
| 2002/0145472 | A1* | 10/2002 | Oh | H03L 7/1978 331/1 A |
| 2004/0085103 | A1* | 5/2004 | Ahn | H03L 7/1978 327/156 |
| 2008/0285704 | A1* | 11/2008 | Chiu | H03K 23/667 377/48 |
| 2008/0303566 | A1* | 12/2008 | Shen | H03L 7/193 327/157 |
| 2012/0319747 | A1* | 12/2012 | Namdar-Mehdiabadi | H03L 7/095 327/149 |

OTHER PUBLICATIONS

Texas Instruments, "AN-1879 Fractional N Frequency Synthesis", Application Report, SNAA062A—Dec. 2008—Revised Apr. 2013, pp. 1-37.
Razavi, Behzad, "Integer-N and Fractional-N Synthesizers", Electrical Engineering Department, University of California, Los Angeles, Mar. 14, 2013, 26 pgs.
Peregrine Semiconductor, "Determining Valid Divide Ratios Using Peregrine PLL Frequency Synthesizers", Application Note AN38, Document No. DOC-57802-1, 2014, 6 pgs.
Peregrine Semiconductor, "3500 MHz Low Power UltraCMOS Divide-by-2 Prescaler Rad-hard for Space Applications", Product Specification PE9301, Document No. 70-0039-02, 2003-2006, 7 pgs.

(Continued)

*Primary Examiner* — Brandon S Cole
(74) *Attorney, Agent, or Firm* — Jaquez Land Greenhaus LLP; Martin J. Jaquez, Esq.; John Land, Esq.

(57) ABSTRACT

A low phase noise frequency divider suitable for use in phase locked loops (PLL) and frequency synthesizers, particular in a fractional-N PLL system having an N frequency divider with a main (M) counter and an auxiliary (A) counter. In some user selectable cases, the count value $C_M$ for the M counter is fixed and only the count value $C_A$ for the A counter is varied. Having a fixed $C_M$ value results in lower phase noise in most cases. For cases where it is not possible to vary $C_M$, then $C_M$ is allowed to vary in a conventional manner to retain a full range of functionality.

17 Claims, 3 Drawing Sheets

(56) References Cited

OTHER PUBLICATIONS

Peregrine Semiconductor, "1.5-3.5 Low Power UltraCMOS Divide-by-8 Prescaler Rad-hard for Space Application", Product Specification PE9303, Document No. 70-0052-02, 2003-2012, 9 pgs.

Peregrine Semiconductor, "1 GHz-7 GHz Low Power UltraCMOS Divide-by-2 Prescaler Rad-hard for Space Applications", Product Specification PE9304, Document No. 70-0152-02, 2003-2006, 7 pgs.

Peregrine Semiconductor, "3.0-13.5 GHz Low Power UltraCMOS Divide-by-4 Prescaler", Product Specfication PE9309, Document No. 70-0241-05, 2007-2010, 6 pgs.

Peregrine Semiconductor, "1500 MHz Low Power UltraCMOS Divide-by-2 Prescaler Rad hard for Space Applications", Product Specification PE9311, Document No. 70-0114-03, 2003-2006,7 pgs.

Peregrine Semiconductor, "1500 MHz Low Power UltraCMOS Divide-by-4 Prescaler Rad hard for Space Applications", Product Specification PE9312, Document No. 70-0199-04, 2003-2008, 7 pgs.

Peregrine Semiconductor, "1500 MHz Low Power UltraCMOS Divide-by-8 Prescaler Rad hard for Space Applications", Product Specification PE9313, Document No. 70-0120-03, 2003-2006, 7 pgs.

Peregrine Semiconductor "2200 MHz UltraCMOS Integer-N PLL for Rad Hard Applications", Product Specification PE9601, Document No. 70-0025-06, 2010, 14 pgs.

Peregrine Semiconductor, "3000 MHz UltraCMOS Integer-N PLL Rad Hard for Space Applications", Product Specification PE9701, Document No. 70-0035-02, 2003-2006, 13 pgs.

Peregrine Semiconductor, "3000 MHz UltraCMOS Integer-N PLL Rad Hard for Space Applications", Product Specification PE9702, Document No. 70-0036-2, 2003-2006, 13 pgs.

Peregrine Semiconductor, "3000 MHz UltraCMOS Integer-N PLL Rad Hard for Space Applications", Product Specification PE9704, Document No. 70-0083-03, 2003-2006, 10 pgs.

Peregrine Semiconductor, "3.2 GHz Delta-Sigma modulated Fractional-N Frequency Synthesizer for Low Phase Noise Applications", Product Specification PE9763, Document No. 70-0140-02, 2003-2006, 15 pgs.

Peregrine Semiconductor, "UltraCMOS Integer-N PLL Frequency Synthesizer for Low Phase Noise Applications", Product Specification PE33241, Document No. DOC-15014-4, 2010-2013, 19 pgs.

Peregrine Semiconductor, "3000 MHz UltraCMOS Integer-N PLL for Low Phase Noise Applications Military Operating Temperature Range", Product Specification PE83336, Document No. 70-0137-05, 2010-2012, 12 pgs.

Peregrine Semiconductor, "3.0 GHz Integer-N PLL for Stringent Military Applications" Product Specification PE83337, 2003, 12 pgs.

Peregrine Semiconductor, "3.5 GHz UltraCMOS Integer-N PLL Rad Hard for Space Applications", Product Specification PE97022, Document No. DOC-29014-2, 2010-2014, 15 pgs.

Peregrine Semiconductor, "3.5 GHz UltraCMOS Integer-N PLL Rad Hard for Space Applications", Product Specification PE97042, Document No. 70-0236-05, 2007-2011, 11 pgs.

Peregrine Semiconductor, "Rad-Hard UltraCMOS Integer-N Frequency Synthesizer for Low Phase Noise Applications", Product Specification PE97240, Document No. DOC-15214-3, 2010-2014, 19 pgs.

Peregrine Semiconductor, "Rad-Hard UltraCMOS Delta-Signma Modulated Fractional-N Frequency Synthesizer for Low Phase Noise Applications", Product Specification PE97632, Document No. DOC-29214-2, 2006-2014, 17 pgs.

* cited by examiner

LOW PHASE NOISE FREQUENCY DIVIDER

BACKGROUND

(1) Technical Field

This invention generally relates to electronic circuitry, and more specifically to frequency dividers suitable for use in phase locked loops and frequency synthesizers.

(2) Background

A phase locked loop (PLL) is an electronic feedback control system that generates an output frequency Fout having a phase that is related to the phase of an input reference frequency Fref. A typical PLL compares the phases of two input frequencies, Fc and Fp, in a phase detector, which produces an error signal e(s) that is proportional to the difference between the phases of the input frequencies. The error signal is then loop filtered and used to drive a variable frequency oscillator, typically a voltage controlled oscillator (VCO), which creates the output frequency Fout. The output frequency Fout is fed through a feedback divider back to the input of the system as Fp, producing a negative feedback loop. If the output frequency Fout drifts, the phase error signal e(s) will increase, driving the output frequency Fout in the opposite direction so as to reduce the error. The other input frequency, Fc, is derived by dividing down a reference frequency Fref, usually derived from a very stable frequency source, such as a crystal oscillator.

PLLs have numerous applications in the field of electronics, including as frequency synthesizers in radio systems.

It is desirable in many applications, and especially in radio frequency (RF) based applications, that the noise levels of a PLL be low. In particular, it is desirable to reduce phase noise, a well-known characteristic of oscillator-based circuits. The present invention addresses these needs.

SUMMARY OF THE INVENTION

It is desirable in many applications, and especially in radio frequency (RF) based applications, that the noise levels of a fractional-N phase locked loop (PLL) system be low. In particular, it is desirable to reduce phase noise, a well-known characteristic of oscillator-based circuits. For a fractional-N PLL using a dual-modulus prescaler (e.g., a 5/6 prescaler), it is possible to have a fixed value $C_M$ for the main (M) counter of an N frequency divider and only vary the value $C_A$ for the associated auxiliary (A) counter, subject to some implementation-specific constraints on the minimum and maximum values of $C_A$. Having a fixed $C_M$ value results in lower phase noise in most cases. Embodiments of the invention take advantage of the above observation and results by fixing the value of $C_M$ in some cases to achieve a low phase noise frequency divider. Since having a fixed $C_M$ value will not work for all frequency divider values N, a user control input allows for the selection of whether $C_M$ is fixed or is allowed to vary, depending on the use condition. This allows a user to disable variation of $C_M$ for cases where it is possible and thus realize a phase noise improvement. For cases where it is not possible to vary $C_M$, then $C_M$ is allowed to vary in a conventional manner to retain a full range of functionality, with the trade-off of an increase in phase noise.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION OF THE INVENTION

Figure 1:
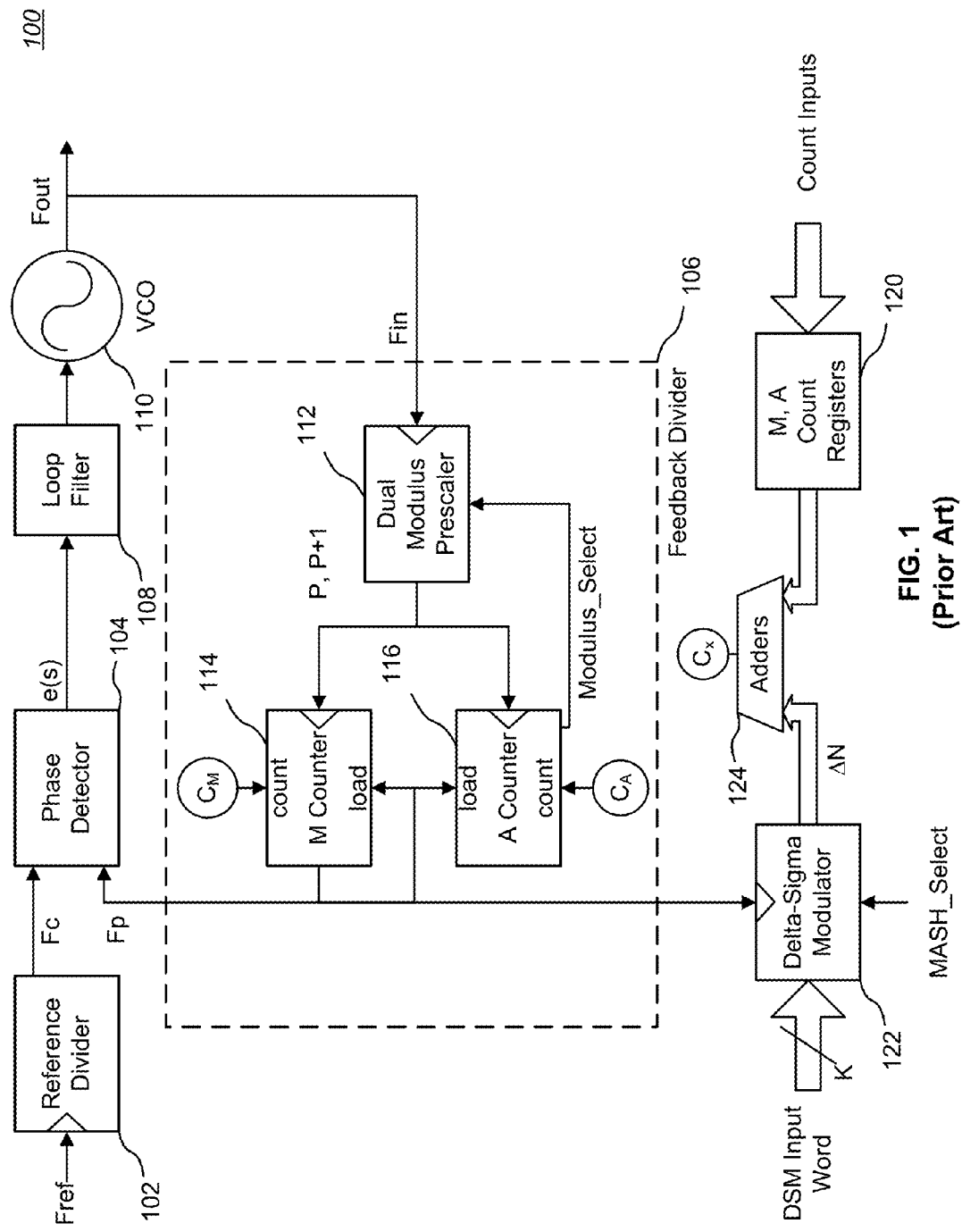
FIG. 1 is a block diagram of one embodiment of a conventional fractional-N phase locked loop system.

FIG. 1 is a block diagram of one embodiment of a conventional fractional-N phase locked loop system 100. A reference frequency, Fref, usually derived from a very stable high frequency source such as a crystal oscillator, is input to a reference divider 102. The reference divider 102 divides the high frequency Fref input down to a more manageable comparison frequency Fc. For example, a 10 MHz crystal oscillator Fref source may be divided down by a factor of 50 to obtain a 200 kHz comparison frequency Fc. By using larger division factors (e.g., 1,000), a finer comparison frequency Fc is achievable (e.g., 10 Hz).

The comparison frequency Fc is applied as one input to a phase detector 104 (typically composed of a phase frequency detector and a charge pump). The other input to the phase detector 104 is a pulse count frequency Fp from a feedback divider 106, described in greater detail below. The phase detector 104 compares the Fc, Fp signals and outputs an error signal e(s).

The error signal e(s) from the phase detector 104 is applied to a loop filter 108 that is typically implemented as a low pass filter in order to suppress spur signals and other noise. The output of the loop filter 108 is applied to a voltage controlled oscillator (VCO) 110 which oscillates at an frequency of Fout. The output frequency Fout is fed through the feedback divider 106 that generates the a pulse count frequency Fp, which is coupled back to the input of the phase detector 104, producing a negative feedback loop. If the output frequency Fout drifts, the phase error signal e(s) will increase (negative or positive), driving the output frequency Fout in the opposite direction so as to reduce the error. When Fc and Fp are equal in phase, the error will be constant and the PLL is said to be in a "locked" condition. The negative feedback loop thus forces the error signal e(s) to approach zero, at which point the feedback divider output Fp and the comparison frequency Fc (and hence the reference frequency Fref) are in phase lock.

The feedback divider 106 is essentially a 1/N divider (also known as an "N counter") that receives the output frequency Fout from the VCO 110 as an input signal Fin and generates the pulse count frequency Fp=Fout/N, where N is a programmable value that sets the relationship between the input and output frequencies in the PLL. In simple PLL designs, N is an integer; in more modern PLL designs, N may be a fractional number. Fractional N feedback dividers allow a PLL to operate with a higher reference frequency Fref while realizing a fine step size by periodically modulating the division ratio of the feedback divider 106 (for example, between N and N+1) such that the average value of Fp contains a fractional element.

Because the output Fout of the VCO 110 may be a fairly high frequency (e.g., 900 MHz), it is common to use a fixed counter element (i.e., a prescaler) within the feedback divider 106 to reduce the input frequency to a more manageable rate that the phase detector 104 can process. For example, assume that a 900 MHz output Fout is required with 10 Hz spacing. A 10 MHz reference frequency Fref might be used, with the reference divider 102 set at 1,000. Then, the N-value for the feedback divider 106 would need to be of the order of 90,000. At first blush, this would mean at least a 17-bit programmable counter capable of dealing with an input frequency Fin of 900 MHz. In the alternative, to handle such frequencies, it makes sense to precede a programmable counter with a fixed counter element (i.e., a prescaler) to bring the very high input frequency down to a range at which standard counters more readily operate. However, using a single-modulus prescaler reduces the system resolution. This issue can be addressed by using a dual-modulus prescaler 112, which is a counter whose division ratio is selected from one of two values (P or P+1) by application of an external control signal, Modulus_Select. For example, the values for P and P+1 may be 5 and 6, or 10 and 11, or selectable between the two number pairs (i.e., 5/6 or 10/11). Other values for P and P+1 may also be used. A dual-modulus prescaler 112 has the advantages of a standard prescaler but without loss of resolution.

The output (P or P+1) of the dual-modulus prescaler 112 is coupled to the clock inputs of two programmable counters, a Master (M) counter 114 and an Auxiliary (A) counter 116. The M counter 114 may be loaded with a count value $C_M$, while the A counter 116 may be loaded with a count value $C_A$, where the value of $C_A$ is constrained to be less than $C_M$. Both counters will decrement towards zero each time the dual-modulus prescaler 112 outputs a signal pulse, which indicates that either P or P+1 frequency cycles of Fout have occurred. When the A counter 116 counts down to zero, its output serves as a Modulus_Select signal to the dual-modulus prescaler 112, thereby toggling the modulus of the dual-modulus prescaler 112 (i.e., from P to P+1, or from P+1 to P). When the M counter 114 counts down to zero, its output Fp causes both counters to be reloaded with respective values $C_A$ and $C_M$. Depending on the values of $C_M$ and $C_A$, the A counter 116 may count down and thus toggle the modulus of the dual-modulus prescaler 112 multiple times before the M counter 114 counts down to zero.

In the illustrated embodiment, the $C_A$ and $C_M$ count values are determined by adding initial externally settable base count inputs (shown stored in respective M, A count registers 120) to the output ΔN of a delta-sigma modulator (DSM) 122 by means of a set of adders 124. Essentially, ΔN is a pseudo-random offset number designed to cause the counts $C_M$, $C_A$ output by the adders 124 to vary the division ratio of the feedback divider 106 such that the average of the output Fp contains a fractional element. Note that in some embodiments, the M, A count registers 120 and the adders 124 may be situated within the DSM 122.

In the illustrated embodiment, a conventional DSM 122 is clocked by the output Fp of the M counter 114. A DSM input control word K determines the fractional value of N by the relation $K/2^L$ for an L-bit wide DSM input control word. Internally, a multi-stage noise shaping (MASH) circuit architecture allows pseudo-random sequencing of several frequencies. In the illustrated embodiment, the MASH circuit architecture of the DSM allows for two modes, either one of which is selectable in response to an externally supplied control signal, MASH_Select. For the illustrated embodiment, a second order fractional dithering MASH mode (MASH 1-1) can output $2^2$ ΔN values (−1, 0, +1, +2), while a third order fractional dithering MASH mode (MASH 1-1-1) can output $2^3$ ΔN values (−3, −2 . . . +3, +4). In the illustrated embodiment, ΔN is represented as a 2's complement number, and thus may represent a positive, zero, or negative value. Note that while the illustrated embodiment describes use of a DSM to provide dithered values for ΔN (and hence for N), other circuits are known that can provide similar functionality with different design tradeoffs.

The value of ΔN from the DSM 122 can thus vary from cycle to cycle in a somewhat random fashion, the cycles being determined by the generation of Fp by the M counter 114. By summing ΔN with the base M and A values set in the M, A count registers 120, the $C_M$ and $C_A$ count values are modulated from cycle to cycle. Accordingly, for each cycle, the feedback divider 106 always counts to N, but N itself varies from cycle to cycle, allowing the feedback divider 106 to behave as a fractional N counter over time. For example, for a 5/6 prescaler, $N=5*(C_M+1)+C_A$, and for a 10/11 prescaler, $N=10*(C_M+1)+C_A$, where $C_M$ and $C_A$ may change each time Fp is generated.

In order to realize the full range of 8 possible states for N (i.e., N−3 to N+4) in a MASH 1-1-1 mode for the DSM 122, both $C_M$ and $C_A$ will vary in most cases. For example, in a PLL having a 5/6 prescaler (where N=5*(M+1)+A), N will equal 80 if the initial base values M=15 and A=0 are stored in the M, A count registers 120; thus, the feedback divider 106 will behave as a "divide by 80" circuit. When the DSM 122 operates in the MASH 1-1-1 mode, ΔN will vary from −3 to +4, thereby modulating N each Fp cycle by generating $C_M$ and $C_A$ as set forth in Table 1.

TABLE 1

| ΔN | $C_M$ | $C_A$ | N |
|---|---|---|---|
| −3 | 14 | 2 | 77 |
| −2 | 14 | 3 | 78 |
| −1 | 14 | 4 | 79 |
| 0 | 15 | 0 | 80 |
| +1 | 15 | 1 | 81 |
| +2 | 15 | 2 | 82 |
| +3 | 15 | 3 | 83 |
| +4 | 15 | 4 | 84 |

It is desirable in many applications, and especially in radio frequency (RF) based applications, that the noise levels of a PLL be low. In particular, it is desirable to reduce phase noise, a well-known characteristic of oscillator-based circuits. One definition of phase noise is the ratio of the noise in a 1 Hz bandwidth at a specified frequency offset, fm, to the oscillator signal amplitude at frequency fo. Spectral purity of the output of a PLL is specified in part by the phase noise.

For a PLL using a dual-modulus prescaler (e.g., a 5/6 prescaler), it is possible to have a fixed values for $C_M$ and only vary the value of $C_A$, subject to some implementation-specific constraints on the minimum and maximum values of $C_A$, as described below. It was established experimentally that having a fixed $C_M$ value results in lower phase noise in most cases. It is believed that fewer state changes in the system produces less energy that can potentially couple to the critical path and degrade the phase noise of the system.

Embodiments of the invention take advantage of the above observation and results by fixing the value of $C_M$ in some cases. Since having a fixed $C_M$ value will not work for all frequency divider values N, a user control input allows for the selection of whether $C_M$ is fixed or is allowed to vary, depending on the use condition. This allows a user to disable variation of $C_M$ for cases where it is possible and thus realize a phase noise improvement. For cases where it is not possible to vary $C_M$, then $C_M$ is allowed to vary in a conventional manner to retain a full range of functionality, with the trade-off of an increase in phase noise.

Figure 2:
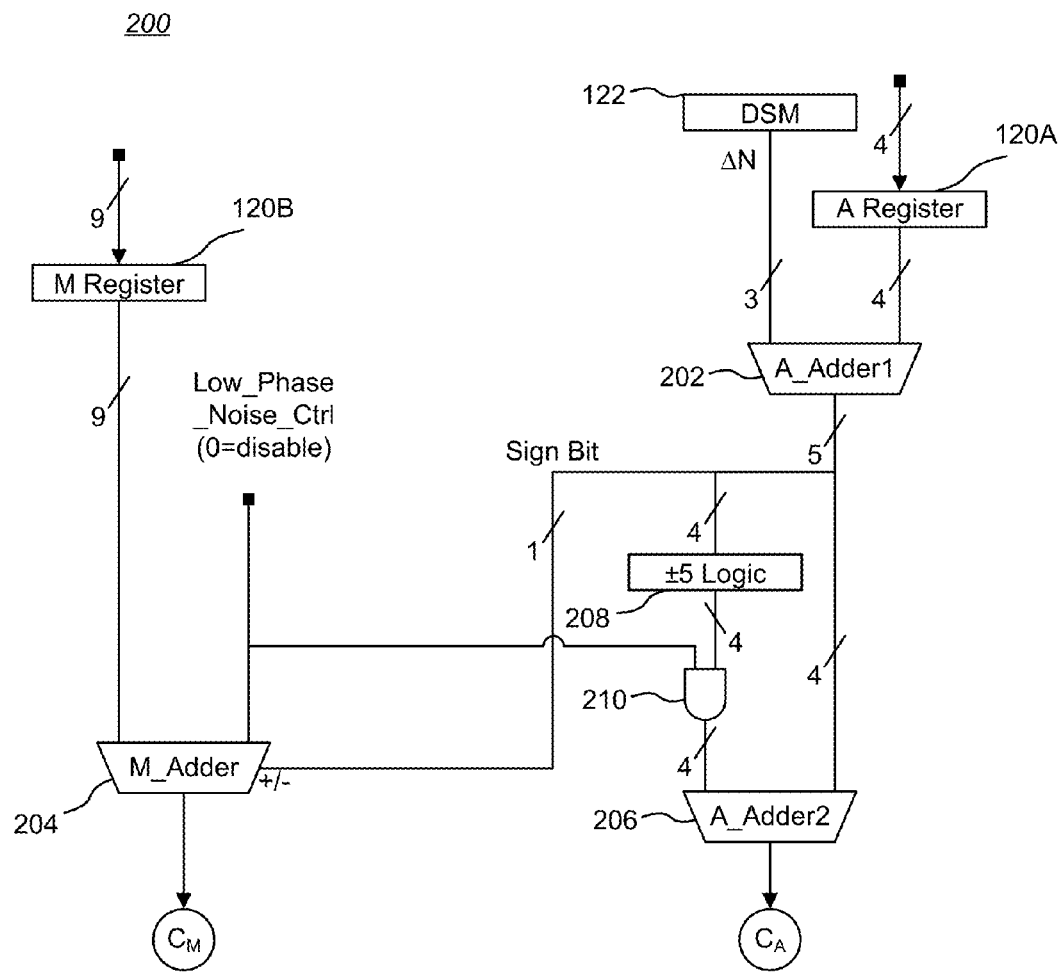
FIG. 2 shows a block diagram of one embodiment of a user-controlled adder circuit for selectively fixing the count value of the M counter.

While there are a number of ways of "toggling" the variability of $C_M$, FIG. 2 shows a block diagram of one embodiment of a user-controlled adder circuit 200 for selectively fixing the count value of the M counter 114. In this particular embodiment, a user control function is created by adding a Low_Phase_Noise_Ctrl input to the adders 124 of FIG. 1 to disable the adder carry and borrow logic from incrementing or decrementing the value of M to compute $C_M$, thereby ensuring that $C_M$ remains fixed.

More particularly, the ΔN output of the DSM 122 is summed in an A_Adder1 202 with an initial value for A stored in an A register 120A; in the illustrated embodiment, ΔN is 3 bits wide (2's complement) and A is 4 bits wide. A Low_Phase_Noise_Ctrl signal input supplied externally from the adder circuit 200 is coupled to one input of an M_Adder 204 and to an AND gate 210. An M value stored in an M register 120B is coupled to another input of the M_Adder 204. The sign bit output from the A_Adder1 202 is coupled to an "add/subtract" input of an M_Adder 204 and determines whether the M value stored in the M register 120B is incremented or decremented by "1" (i.e., Low_Phase_Noise_Ctrl="1") as a function of the sign bit to generate $C_M$, or whether the M value is passed unchanged (i.e., Low_Phase_Noise_Ctrl="0") so that $C_M$=M.

The remaining bits output by the A_Adder1 202 are coupled to one set of inputs of an A_Adder2 206 and to a logic block 208 that causes "5" (decimal) to be added to or subtracted from the output sum of the A_Adder1 202 according to the value of the sum, as set forth in Table 2.

TABLE 2

| Sum | Logic Block Output |
|---|---|
| >4 | −5 |
| 0-4 | 0 |
| <0 | +5 |

The output of the logic block 208 is selectively coupled to a second set of inputs to the A_Adder2 206, in essence through a 4-bit wide AND gate 210. When the Low_Phase_Noise_Ctrl input is "1", the output of the logic block 208 (−5, 0, +5) is summed in the A_Adder2 206 with the output of the A_Adder1 202 to generate $C_A$ in a normal fashion (i.e., adjusting $C_A$ as $C_M$ varies). When the Low_Phase_Noise_Ctrl input is "0", the output of the AND gate 210 is forced to "0" and thus the output of the A_Adder1 202 passes through the A_Adder2 206 unchanged (i.e., adding or subtracting "0" from a value leaves the value unchanged).

In the illustrated embodiment, when the Low_Phase_Noise_Ctrl input is set to "1", $C_M$ is fixed in value to be equal to M, only $C_A$ varies, and $C_A$ can be set to a wider range of values to generate N, as shown in Table 3.

TABLE 3

| ΔN | $C_M$ (=M) | $C_A$ | N |
|---|---|---|---|
| −3 | 14 | 2 | 77 |
| −2 | 14 | 3 | 78 |
| −1 | 14 | 4 | 79 |
| 0 | 14 | 5 | 80 |
| +1 | 14 | 6 | 81 |

TABLE 3-continued

| ΔN | $C_M$ (=M) | $C_A$ | N |
|---|---|---|---|
| +2 | 14 | 7 | 82 |
| +3 | 14 | 8 | 83 |
| +4 | 14 | 9 | 84 |

The only restriction in this specific illustrated embodiment is that the maximum value for $C_A$ is the lesser of M+1 or 15 (the highest count value—binary 1111—of a 4-bit counter), and the minimum value for $C_A$ is 0. In the case shown in Table 3, the maximum $C_A$ value needed is 9, which is less than 15 (i.e., 14+1); the minimum $C_A$ value needed is 2, which is non-negative. Other embodiments would have similar constraints on the minimum and maximum values of $C_A$ relative to M and the bit-width of the associated $C_A$ counter, but may have different values than apply to the example shown in FIG. 2 and Table 3. In addition, for dual-modulus prescalers, there are additional restrictions if N is less than P*(P−1) because there would be non-contiguous integer counts. As noted above, P is the number of the modulus in a dual modulus prescaler; for example, a 5/6 prescaler has a P of 5. Such restrictions can be avoided by keeping N above the minimum of P*(P−1).

In sum, FIG. 2 shows one possible embodiment of combining circuitry having a first mode of operation in which a variable offset set number ΔN, a settable M counter value, and a settable A counter value are combined to generate an actual M counter value $C_M$ and to generate an actual A counter value $C_A$ in a first range of values, and having a second mode of operation in which the variable offset set number ΔN and the settable A counter value are combined to generate an actual A counter value $C_A$ in a second range of values and in which the settable M counter value is passed unchanged as the actual M counter value $C_M$. As should be apparent, different value widths and different logic states for activating or deactivating the variability of $C_M$ may be applied without departing from the inventive concept.

As should be apparent, in limited applications in which a wide range of N is not required, then $C_M$ can be directly set from the M register 120B and never varied. Thus, all variability for N would be achieved by only varying $C_A$.

Figure 3:
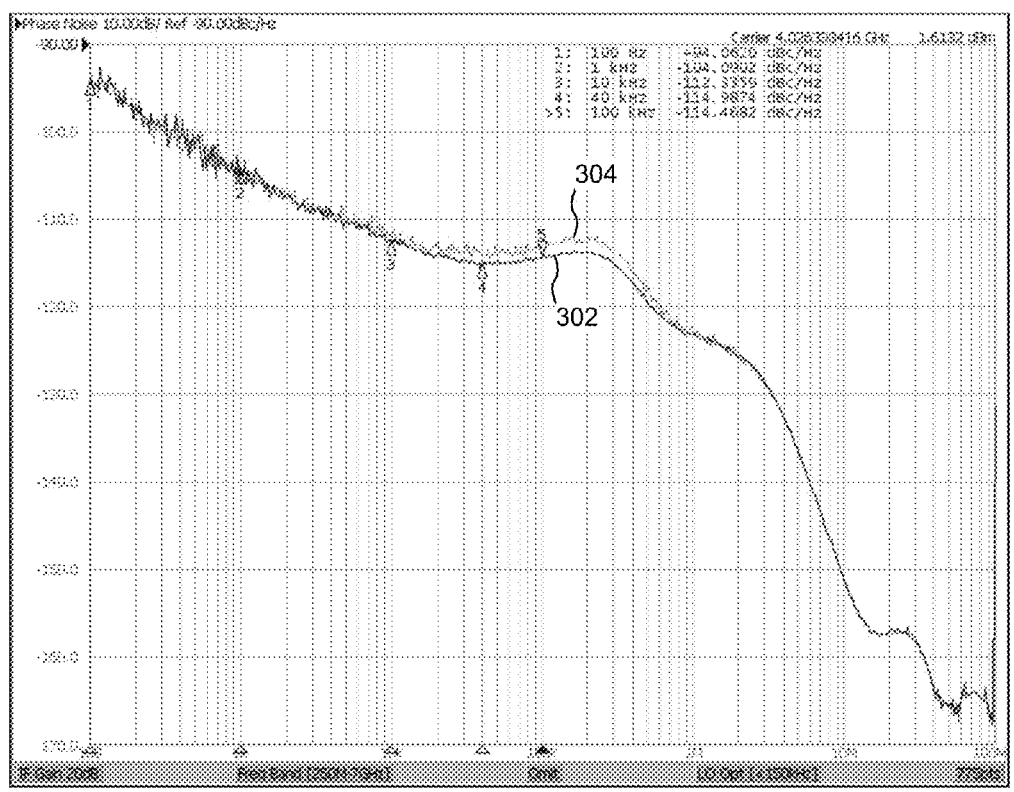
FIG. 3 is a graph showing the improvement in phase noise of a fixed value M counter embodiment in comparison to a variable value M counter embodiment.

FIG. 3 is a graph 300 showing the improvement in phase noise of a fixed value M counter embodiment 302 in comparison to a variable value M counter embodiment 304; as should be evident, the plots are for particular embodiments under particular conditions. The difference for the illustrated embodiments amounts to as much as about 2-3 dB, which is significant for these types of systems. Markers 1-5 show various frequencies on the illustrated plots at which phased noise was determined, as shown in the table inset in FIG. 3.

Another aspect of the invention includes a method for reducing the phase noise of an N feedback divider having a master counter and an auxiliary counter, including the steps of:

STEP 1: Fixing a count value for the master counter for cases in which all desired values of N can be achieved by varying only a count value for the auxiliary counter; and STEP 2: Varying only the count value for the auxiliary counter.

Yet another aspect of the invention includes a method for reducing the phase noise of an N feedback divider having a master counter and an auxiliary counter, including the steps of STEP 1: Fixing a count value for the master counter for cases in which all desired values of N can be achieved by varying only a count value for the auxiliary counter; and STEP 2: Allowing the count value for the master counter to vary in cases in which all desired values of N cannot be achieved by varying only the count value for the auxiliary counter.

Still another aspect of the invention includes a method for reducing the phase noise of an N feedback divider having a master counter and an auxiliary counter, including the steps of:

STEP 1: for cases in which all desired values of N can be achieved by varying only a count value for the auxiliary counter: fixing a count value for the master counter, and generating a count value for the auxiliary counter within a first range of values; and STEP 2: for cases in which all desired values of N cannot be achieved by varying only the count value for the auxiliary counter: generating a variable count value for the master counter, and generating a count value for the auxiliary counter within a second range of values.

Another aspect of the invention includes a method for reducing the phase noise of an N feedback divider having a master counter and an auxiliary counter, including the steps of:

STEP 1: combining, in a first mode of operation, a variable offset set number, a settable master counter value, and a settable auxiliary counter value to generate an actual master counter value and to generate an actual auxiliary counter value in a first range of values, and providing the actual master counter value and the actual auxiliary counter value to the master counter and the auxiliary counter, respectively; and STEP 2: combining, in a second mode of operation, the variable offset set number and the settable auxiliary counter value to generate an actual auxiliary counter value in a second range of values, and passing the settable master counter value unchanged as the actual master counter value, and providing the actual master counter value and the actual auxiliary counter value to the master counter and the auxiliary counter, respectively, wherein phase noise of the feedback divider is lower during the second mode of operation than during the first mode of operation.

Other aspects of the above methods including varying the count value for the auxiliary counter by combining a variable offset set number and a settable auxiliary counter value, and using a delta-sigma modulator as the source for the variable offset number.

A number of embodiments of the invention have been described. It is to be understood that various modifications may be made without departing from the spirit and scope of the invention. For example, some of the steps described above may be order independent, and thus can be performed in an order different from that described. Various activities described with respect to the methods identified above can be executed in repetitive, serial, or parallel fashion. It is to be understood that the foregoing description is intended to illustrate and not to limit the scope of the invention, which is defined by the scope of the following claims, and that other embodiments are within the scope of the claims.

What is claimed is:

1. A frequency divider including:
(a) a master counter;
(b) an auxiliary counter coupled to the master counter;
(c) a source for a settable master counter value;
(d) a source for a settable auxiliary counter value;
(e) a source for a variable offset number;
(f) combining circuitry having a first mode of operation in which the variable offset set number, the settable master counter value, and the settable auxiliary counter value are combined to generate an actual master counter value and to generate an actual auxiliary counter value in a first range of values, and having a second mode of operation in which the variable offset set number and the settable auxiliary counter value are combined to generate an actual auxiliary counter value in a second range of values and in which the settable master counter value is passed unchanged as the actual master counter value; and
(g) coupling circuitry for providing the actual master counter value to the master counter and the actual auxiliary counter value to the auxiliary counter;
wherein phase noise of the frequency divider is lower in the second mode of operation than in the first mode of operation.

2. The frequency divider of claim 1 wherein the source for the variable offset number is a delta-sigma modulator.

3. The frequency divider of claim 1 further including a dual modulus prescaler coupled to the master counter and the auxiliary counter.

4. A phase locked loop including:
(a) a reference divider for receiving a reference frequency and generating a comparison frequency;
(b) a frequency divider having a master counter and an auxiliary counter, for generating a pulse count frequency from an applied system output frequency;
(c) a phase detector for comparing the comparison frequency with the pulse count frequency to determine an error signal;
(d) a loop filter coupled to the phase detector for passing low frequencies and blocking high frequencies in the error signal;
(e) a voltage controlled oscillator coupled to the loop filter for generating the system output frequency having a frequency and phase determined by the error signal;
(f) a source for a settable master counter value;
(g) a source for a settable auxiliary counter value;
(h) a source for a variable offset number;
(i) combining circuitry having a first mode of operation in which the variable offset set number, the settable master counter value, and the settable auxiliary counter value are combined to generate an actual master counter value and to generate an actual auxiliary counter value in a first range of values, and having a second mode of operation in which the variable offset set number and the settable auxiliary counter value are combined to generate an actual auxiliary counter value in a second range of values and in which the settable master counter value is passed unchanged as the actual master counter value; and
(j) coupling circuitry for providing the actual master counter value to the master counter and the actual auxiliary counter value to the auxiliary counter;
wherein phase noise of the phase locked loop is lower in the second mode of operation than in the first mode of operation.

5. The phase locked loop of claim 4 wherein the source for the variable offset number is a delta-sigma modulator.

6. The phase locked loop of claim 4 where the frequency divider further includes a dual modulus prescaler coupled to the master counter and the auxiliary counter for dividing down the applied system output frequency.

7. A method for reducing the phase noise of an N feedback divider having a master counter and an auxiliary counter, including the steps of:
   (a) combining, in a first mode of operation, a variable offset set number, a settable master counter value, and a settable auxiliary counter value to generate an actual master counter value and to generate an actual auxiliary counter value in a first range of values, and providing the actual master counter value and the actual auxiliary counter value to the master counter and the auxiliary counter, respectively; and
   (b) combining, in a second mode of operation, the variable offset set number and the settable auxiliary counter value to generate an actual auxiliary counter value in a second range of values, and passing the settable master counter value unchanged as the actual master counter value, and providing the actual master counter value and the actual auxiliary counter value to the master counter and the auxiliary counter, respectively, wherein phase noise of the feedback divider is lower during the second mode of operation than during the first mode of operation.

8. The method of claim 7 further including using a delta-sigma modulator as the source for the variable offset number.

9. A method for reducing the phase noise of an N feedback divider having a master counter and an auxiliary counter, including the steps of:
   (a) fixing a count value for the master counter for cases in which all desired values of N can be achieved by varying only a count value for the auxiliary counter; and
   (b) varying only the count value for the auxiliary counter.

10. The method of claim 9 further including varying the count value for the auxiliary counter by combining a variable offset set number and a settable auxiliary counter value.

11. The method of claim 10 further including using a delta-sigma modulator as the source for the variable offset number.

12. A method for reducing the phase noise of an N feedback divider having a master counter and an auxiliary counter, including the steps of:
   (a) fixing a count value for the master counter for cases in which all desired values of N can be achieved by varying only a count value for the auxiliary counter; and
   (b) allowing the count value for the master counter to vary in cases in which all desired values of N cannot be achieved by varying only the count value for the auxiliary counter.

13. The method of claim 12 further including varying the count value for the auxiliary counter by combining a variable offset set number and a settable auxiliary counter value.

14. The method of claim 13 further including using a delta-sigma modulator as the source for the variable offset number.

15. A method for reducing the phase noise of an N feedback divider having a master counter and an auxiliary counter, including the steps of:
   (a) for cases in which all desired values of N can be achieved by varying only a count value for the auxiliary counter:
      (1) fixing a count value for the master counter; and
      (2) generating a count value for the auxiliary counter within a first range of values; and
   (b) for cases in which all desired values of N cannot be achieved by varying only the count value for the auxiliary counter:
      (1) generating a variable count value for the master counter; and
      (2) generating a count value for the auxiliary counter within a second range of values.

16. The method of claim 15 further including varying the count value for the auxiliary counter by combining a variable offset set number and a settable auxiliary counter value.

17. The method of claim 16 further including using a delta-sigma modulator as the source for the variable offset number.

* * * * *